US008762979B2

(12) United States Patent
Kao

(10) Patent No.: US 8,762,979 B2
(45) Date of Patent: Jun. 24, 2014

(54) KEYBOARD DEFINITION UPDATING METHOD AND COMPUTER SYSTEM

(75) Inventor: Ming-Chun Kao, New Taipei (TW)

(73) Assignee: Wistron Corporation, Hsichih, New Taipei (TW)

( * ) Notice: Subject to any disclaimer, the term of this patent is extended or adjusted under 35 U.S.C. 154(b) by 248 days.

(21) Appl. No.: 13/052,120

(22) Filed: Mar. 21, 2011

(65) Prior Publication Data

US 2011/0239206 A1 Sep. 29, 2011

(30) Foreign Application Priority Data

Mar. 25, 2010 (TW) ................................ 99108882 A

(51) Int. Cl.
*G06F 9/44* (2006.01)
*G06F 1/24* (2006.01)
*G06F 9/06* (2006.01)
*G06F 17/00* (2006.01)

(52) U.S. Cl.
USPC ............ 717/168; 713/100; 395/653; 707/600

(58) Field of Classification Search
None
See application file for complete search history.

(56) References Cited

U.S. PATENT DOCUMENTS

| | | | | |
|---|---|---|---|---|
| 5,579,522 A | * | 11/1996 | Christeson et al. | 713/2 |
| 5,974,250 A | * | 10/1999 | Angelo et al. | 713/100 |
| 6,769,059 B1 | * | 7/2004 | Qureshi et al. | 713/2 |
| 7,089,270 B2 | * | 8/2006 | Ren et al. | 707/695 |
| 2002/0152305 A1 | * | 10/2002 | Jackson et al. | 709/224 |
| 2003/0167354 A1 | * | 9/2003 | Peppers et al. | 709/327 |
| 2004/0260734 A1 | * | 12/2004 | Ren et al. | 707/203 |
| 2006/0015861 A1 | * | 1/2006 | Takata et al. | 717/168 |
| 2006/0190476 A1 | * | 8/2006 | Mettovaara et al. | 707/102 |
| 2008/0126772 A1 | * | 5/2008 | Ashwood et al. | 713/1 |
| 2009/0300421 A1 | * | 12/2009 | Lan et al. | 714/36 |
| 2011/0072254 A1 | * | 3/2011 | Kuang et al. | 713/2 |

FOREIGN PATENT DOCUMENTS

CN 101359308 A 2/2009

OTHER PUBLICATIONS

Vincent J. Zimmer, Unified Extensible Firmware Interface Specification, Version 2.1, Jan. 23, 2007. http://www.uefi.org. Search performed on Oct. 14, 2013.*
Office action mailed on Dec. 25, 2012 for the China application No. 201010138008.6, p. 3 line 3~44 and p. 4 line 1~2.
Office action mailed on Apr. 26, 2013 for the Taiwan application No. 099108882, filing date: Mar. 25, 2010, p. 2 line 4~26, p. 3~4 and p. 5 line 1~2.

* cited by examiner

*Primary Examiner* — Don Wong
*Assistant Examiner* — Mohammad Kabir
(74) *Attorney, Agent, or Firm* — Winston Hsu; Scott Margo

(57) ABSTRACT

A keyboard definition updating method for a computer system includes generating an updating scan code; storing the updating scan code into a storage device of the computer system; and accessing the updating scan code when the updating scan code stored in the storage device is detected and utilizing the updating scan code for the scan code of the computer system.

12 Claims, 2 Drawing Sheets

KEYBOARD DEFINITION UPDATING METHOD AND COMPUTER SYSTEM

BACKGROUND OF THE INVENTION

1. Field of the Invention

The present invention relates to a keyboard definition updating method and related computer system, more particularly to a keyboard definition updating method capable of automatically changing the corresponding keyboard definition without updating a new version of a BIOS released by a product manufacturer.

2. Description of the Prior Art

With progress in computer science and information engineering, computer system becomes essential part of everyday life, including functions such as real-time network communication, E-mail, information inquiry, multimedia processing, and data access. Thus, people use electronic products with computer system, such as notebook, personal digital assistant, or tablet personal computer almost everywhere.

A keyboard is a common input apparatus in the computer system. Each key of the keyboard corresponds to a unique scan code. When a user presses a key on the keyboard, the corresponding scan code of the pressed key is transmitted to an embedded controller of the computer system. Accordingly, the embedded controller passes the corresponding scan code to a processor of the computer system for processing.

On the other hand, during the manufacturing process of electronic products, product manufacturers need to produce various products that conform to requirements of customers. For example, regarding function of the keyboard, each customer may have different purposes and requirements. In such a situation, the product manufacturer updates a basic input output system (BIOS) of the electronic product with the corresponding scan code to realize the required keyboard function change. However, the above-mentioned method is likely to cause a BIOS version upgrade confusion problem. Moreover, if the customer has another keyboard function requirement, the product manufacturer must merge the corresponding scan code to a new BIOS file and issue the new BIOS file. After that, the customer needs to get the new BIOS file and update the BIOS of the computer system with the new BIOS file to change functions of the keyboard. As a result, the customer cannot rapidly change the keyboard functions, thus causing inconvenience. In addition, for mass production, frequent BIOS updates increase production workload and complexity of product testing.

SUMMARY OF THE INVENTION

It is therefore an objective of the present invention to provide a keyboard definition updating method and related computer system.

The present invention discloses a keyboard definition updating method for a computer system and includes: generating an updating scan code, storing the updating scan code into a storage device of the computer system, and accessing the updating scan code when the updating scan code stored in the storage device is detected and utilizing the updating scan code for the computer system.

The present invention further discloses a computer system comprising a processor for controlling operation of the computer system, a keyboard for sending signals to the processor when being pressed, and a storage device. Wherein an updating scan code is generated by the computer system and stored into the storage device, and when the updating scan code stored in the storage device is detected, the updating scan code is accessed from the storage device and utilized for the scan code of the computer system.

These and other objectives of the present invention will no doubt become obvious to those of ordinary skill in the art after reading the following detailed description of the preferred embodiment that is illustrated in the various figures and drawings.

DETAILED DESCRIPTION

The invention provides a method for manually setting and modifying keyboard definitions according to user requirements.

Figure 1:
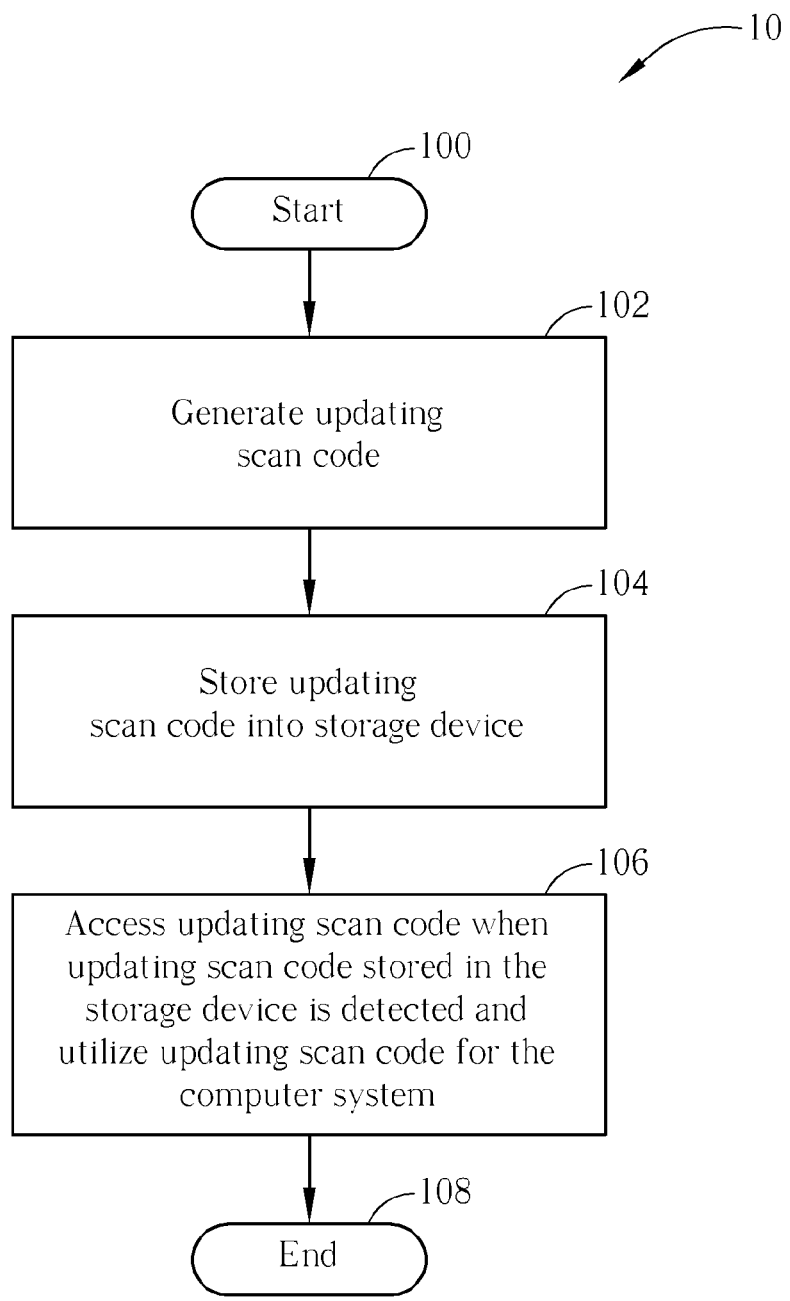
FIG. 1 is a flowchart of keyboard definition updating procedure according to an embodiment of the present invention.

Please refer to FIG. 1, a keyboard definition updating procedure 10 according to an embodiment of the present invention. The computer system includes a processor, an embedded controller, a keyboard, and a storage device. The processor is utilized for controlling operation of the computer system. When the keyboard is pressed, the keyboard sends a corresponding signal to the processor for corresponding processing. The keyboard definition updating procedure 10 includes the following steps:

Step 100: Start.
Step 102: Generate an updating scan code.
Step 104: Store the updating scan code into the storage device.
Step 106: Access the updating scan code when the updating scan code stored in the storage device is detected and utilize the updating scan code for the computer system.
Step 108: End.

According to the procedure 10, when a user has a requirement of using a new keyboard functions, the user can utilize the computer system to generate an updating scan code corresponding to the new keyboard function, and the generated updating scan code can be stored into the storage device. Moreover, the computer system is capable of detecting whether the updating scan code is stored in the storage device and determining updating requirement. If the updating scan code is in the storage device, the updating scan code can be utilized as the scan code of the computer system for realizing the new keyboard function. In other words, through the procedure 10, the user can directly modify the keyboard definition by using the updating scan code for the computer system to realize the corresponding function change of the keyboard. Therefore, the user does not require an addition action, i.e. updating a new BIOS version from the manufacturer, to upgrade the new scan code for the new keyboard function in the computer system.

In practice, a corresponding scan code can be transmitted to the embedded controller (or a keyboard controller) after the keyboard of the computer system is pressed, and the embedded controller can pass the corresponding scan code to the processor of the computer system for related processes. Therefore, in Step 102, the user can utilize the computer system to generate the corresponding updating scan code in accordance with functions and correspondence relationships of each keyboard demand. For example, the invention is capable of utilizing a text editor to generate a binary updating scan code according to the user's requirement.

In Step 104, the updating scan code is stored into the storage. For example, the computer system execute a burning program to burn the updating scan code generated in Step 102 into the storage device. This should not be a limitation of the invention, any method which can store the updating scan code into the storage is suitable. In addition, the aforementioned storage device can be any apparatus which can store digital data, such as ROM, EEPROM, flash memory, and nonvolatile memory. For example, the storage device can be a flash memory with a serial peripheral interface (SPI).

Figure 2:
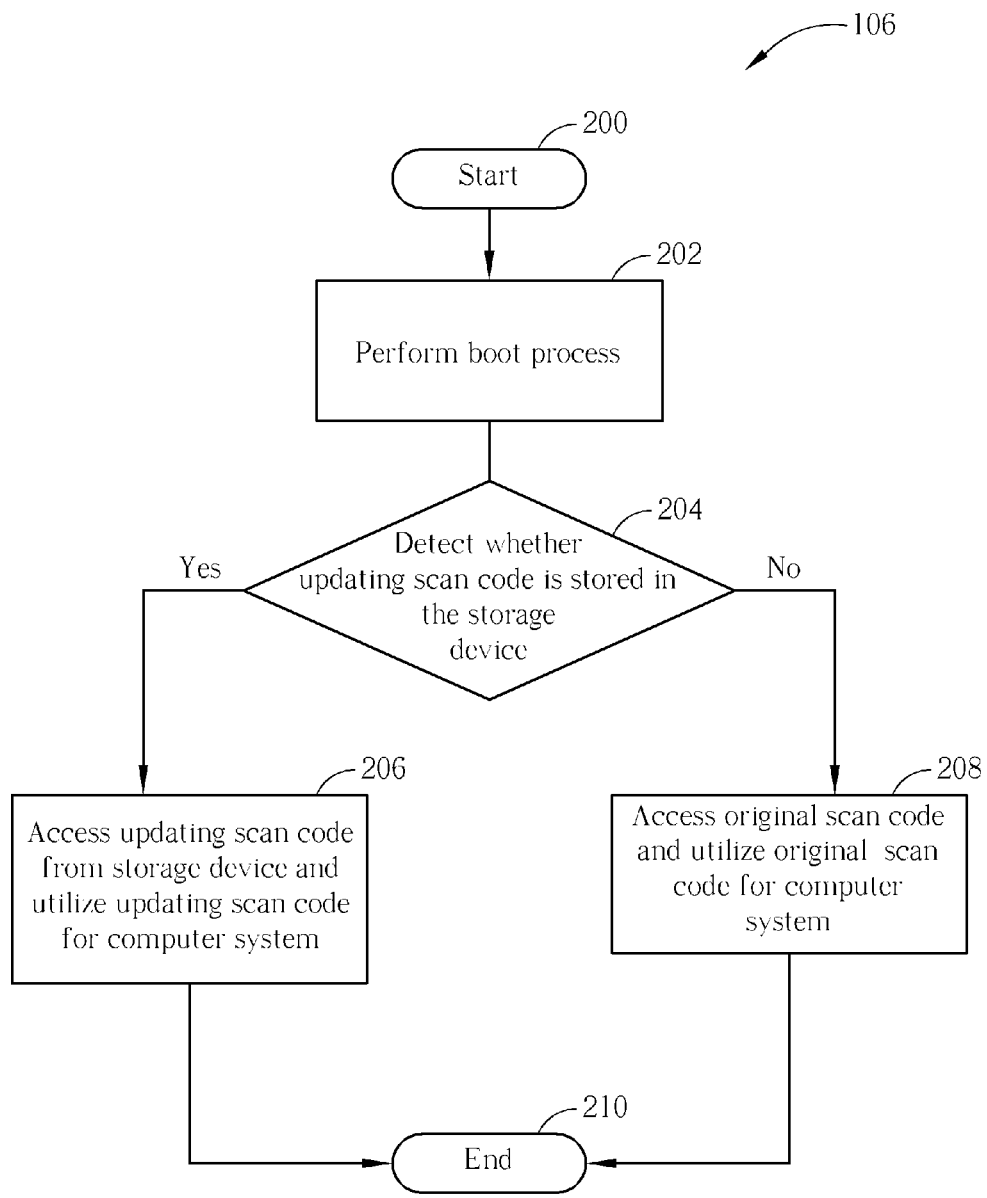
FIG. 2 is a flowchart illustrating detailed steps of detecting and changing an updating scan code stored in a storage device.

Note that the procedure 10 is an exemplary embodiment of the invention and details thereof should not be considered limiting on the scope of the present invention. Those skilled in the art should observe that the procedure 10 shown in FIG. 1 can include other intermediate steps, or several steps of the procedure 10 can be merged into a single step for suitable modifications without departing from the spirit of the present invention. For example, Step 106 can respectively include other detailed steps. Please refer to FIG. 2. FIG. 2 is a flowchart illustrating the detailed steps of detecting the updating scan code stored in the storage device and changing the scan code (i.e. Step 106) shown in FIG. 1. Step 106 further includes, but is not limited to, the following steps:

Step 200: Start.

Step 202: Perform a boot process.

Step 204: Detect whether the updating scan code is stored in the storage device. If yes, go to Step 206; otherwise, go to Step 208.

Step 206: Access the updating scan code from the storage device and utilize the updating scan code for the computer system. After that, go to Step 210.

Step 208: Access an original scan code and utilize the original scan code for the computer system.

Step 210: End.

According to the steps shown in FIG. 2, the computer system detects whether the updating scan code is stored in the storage device during the boot process. If the updating scan code is stored in the storage device, access the updating scan code from the storage device and apply as the scan code of the computer system. In other words, replace the scan code of the computer system with the detected updating scan code when the updating scan code is in the storage device. During typical boot process, the embedded controller loads the original scan code from the storage device for system operations. Therefore, the invention utilize the embedded controller to detect the updating scan code corresponding to a new keyboard function in the storage device and access the updating scan code from the storage device accordingly in order to replace the scan code of the computer system for changing keyboard definition of the keyboard.

Please note that if a substantially identical result can be obtained, the steps shown in FIG. 2 are not limited to be performed according to the order shown in FIG. 2. For example, Step 208 can be inserted between Step 202 and Step 204. In such a situation, Step 208 can be implemented after Step 202 has completed and the other steps can be implemented in order. This is, during a boot process (Step 202), the embedded controller can load the original scan code of the computer system as the scan code (Step 208) and detect whether the updating scan code is stored in the storage device (Step 204). Moreover, if the updating scan code is detected in the storage device, the embedded controller can further load the updating scan code from the storage device for application as the scan code of the computer system instead.

In summary, the invention provides the vendor or the user a simple and rapid manual change method of the keyboard definition without depending on the new version of the BIOS released by the product manufacturer. In other words, the invention offers the user a more flexible and convenient use scheme of the keyboard for enhancing function extensibility of the keyboard having a finite number of keys and improving the individual autonomy of the user. Moreover, for the product manufacturer, the invention reduces the complexity of outgoing flow in the mass production flow and avoid delivery errors effectively.

Those skilled in the art will readily observe that numerous modifications and alterations of the device and method may be made while retaining the teachings of the invention.

What is claimed is:

1. A keyboard definition updating method without updating BIOS for a computer system comprising:
generating an updating scan code corresponding to a new keyboard function;
storing the updating scan code into a storage device of the computer system;
detecting whether the updating scan code is stored in the storage device during a boot process of the computer system; and
if the updating scan code is in the storage device, accessing the updating scan code and utilizing the updating scan code for the computer system for realizing the new keyboard function, without updating BIOS.

2. The keyboard definition updating method of claim 1, wherein the step of generating the updating scan code comprises utilizing a text editor to generate the updating scan code.

3. The keyboard definition updating method of claim 1, wherein the step of storing the updating scan code to the storage device of the computer system comprises executing a burning program to burn the updating scan code to the storage device of the computer system.

4. The keyboard definition updating method of claim 1, wherein the step of detecting whether the updating scan code is stored in the storage device during the boot process of the computer system comprises detecting whether the updating scan code is stored in the storage device when an embedded controller of the computer system performs the boot process.

5. The keyboard definition updating method of claim 1 further comprising:
accessing an original scan code and utilizing the original scan code for the scan code of the computer system when the updating scan code is not detected in the storage device.

6. The keyboard definition updating method of claim 1, wherein the updating scan code corresponds to a keyboard of the computer system.

7. A computer system for updating keyboard definition without updating BIOS, comprising:
a processor for controlling operation of the computer system;
a keyboard for sending signals to the processor when the keyboard is pressed; and
a storage device;
wherein an updating scan code corresponding to a new keyboard function of the keyboard is generated by the computer system and stored into the storage device, the computer system detects whether the updating scan code is stored in the storage device during a boot process and after the updating scan code is detected in the storage device, the computer system accesses the updating scan code from the storage device and utilizes the updating scan code for the computer system for realizing the new keyboard function, without updating BIOS.

8. The computer system of claim 7, wherein the computer system utilizes a text editor for generating the updating scan code.

9. The computer system of claim 7, wherein the computer system utilizes the processor to execute a burning program to burn the updating scan code to the storage device.

10. The computer system of claim 7 further comprising an embedded controller for detecting whether the updating scan code is stored in the storage device while performing the boot process.

11. The computer system of claim 7, wherein when the updating scan code is not detected in the storage device, the computer system accesses an original scan code and utilizes the original scan code for the computer system.

12. The computer system of claim 7, wherein the updating scan code corresponds to the keyboard.

* * * * *